United States Patent
Song et al.

(10) Patent No.: US 9,026,894 B1
(45) Date of Patent: May 5, 2015

(54) CHANNEL DECODER AND METHOD FOR GENERATING EQUALIZED DATA AND DATA ESTIMATES BASED ON MULTIPLE SETS OF DEPTHS PROVIDED VIA A VITERBI ALGORITHM

(71) Applicant: Marvell International Ltd., Hamilton (BM)

(72) Inventors: Hongwei Song, Longmont, CO (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/854,510

(22) Filed: Apr. 1, 2013

Related U.S. Application Data

(63) Continuation of application No. 13/219,917, filed on Aug. 29, 2011, now Pat. No. 8,413,032, which is a continuation of application No. 11/784,291, filed on Apr. 6, 2007, now Pat. No. 8,010,883.

(60) Provisional application No. 60/796,444, filed on May 1, 2006.

(51) Int. Cl.
  *H03M 13/03* (2006.01)
  *G11B 20/18* (2006.01)

(52) U.S. Cl.
  CPC ........ *G11B 20/1866* (2013.01); *G11B 20/1833* (2013.01)

(58) Field of Classification Search
  CPC .......................... H03M 13/41; H03M 13/4107
  USPC ........... 714/795, 796, 794; 375/262, 286, 341
  See application file for complete search history.

(56) References Cited

U.S. PATENT DOCUMENTS

| | | | |
|---|---|---|---|
| 4,601,044 A * | 7/1986 | Kromer et al. | 375/286 |
| 5,583,706 A | 12/1996 | Dudley et al. | |
| 5,585,975 A | 12/1996 | Bliss | |
| 5,757,855 A * | 5/1998 | Strolle et al. | 375/262 |
| 6,151,178 A | 11/2000 | Glover | |
| 6,249,395 B1 | 6/2001 | Conway | |
| 6,278,754 B1 | 8/2001 | Thomas et al. | |
| 6,597,742 B1 | 7/2003 | He et al. | |
| 6,678,862 B1 | 1/2004 | Bergmans et al. | |
| 6,711,213 B2 | 3/2004 | He et al. | |

(Continued)

OTHER PUBLICATIONS

Kao et al; "Wide-area track erasure in perpendicular recording"; Paper No. 31aC-02; Feb. 2005; 20 pages.

(Continued)

*Primary Examiner* — Fritz Alphonse

(57) ABSTRACT

A channel decoder includes a demodulator, a filter, a detector module, and first and second circuits. The demodulator receives an input signal based on data read from a storage medium, and demodulates the input signal to generate a data signal. The filter generates equalized data based on the data signal. The detector module executes a Viterbi algorithm based on the equalized data to generate estimates of data originally stored in the storage medium, and based on the execution of the Viterbi algorithm, generates a first and second sets of depths. The first set of depths includes depths larger than depths in the second set of depths. The first circuit generates a first error signal based on the first set of depths. The second circuit generates a second error signal based on the second set of depths. The filter generates the equalized data based on the first and second error signals.

20 Claims, 8 Drawing Sheets

(56) References Cited

U.S. PATENT DOCUMENTS

| | | | |
|---|---|---|---|
| 6,731,443 | B2 | 5/2004 | Bliss et al. |
| 6,788,482 | B2 | 9/2004 | Bliss et al. |
| 6,804,695 | B1 | 10/2004 | Hsu |
| 6,819,514 | B1 | 11/2004 | Behrens et al. |
| 6,862,324 | B1 | 3/2005 | Lui et al. |
| 7,142,585 | B2 | 11/2006 | Baltersee et al. |
| 7,151,642 | B2 | 12/2006 | Ohkubo et al. |
| 7,308,057 | B1 | 12/2007 | Patapoutian |
| 7,333,532 | B2 | 2/2008 | Baltersee et al. |
| 7,421,643 | B2 | 9/2008 | Song et al. |
| 7,440,208 | B1 | 10/2008 | McEwen et al. |
| 7,590,929 | B2 | 9/2009 | Morita et al. |

OTHER PUBLICATIONS

Hitachi Storage Technologies; "Perpendicular Recording"; http://www.hitachigst.com/hdd/research/recording head/pr/index.html; Oct. 13, 2006; 2 pages.

IBM Research; "Disk storage"; http://www.surich.ibm.com/sys/storage/disk.html; Oct. 13, 2006; 4 pages.

LeCroy Corporation; "Media Noise vs. Electronics Noise"; Dec. 2006; 5 pages.

ANSI/IEEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 528 pages.

IEEE Std 802.11 a-1999 (Supplement to IEEE Std 802.11-1999) [Adopted by ISO/IEC and redesignated as ISO/IEC and redesignated as ISO/IEC 8802-11: 1999/Amd 1:2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specs High-speed Physical Layer in the 5 GHz Band; LAN/MAN Standards Committee of the IEEE Computer Society; 91 pages.

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std P802.11g/D8.2, Apr. 2003 (Supplement to ANSI/IEEE Std 802.11-1999(Reaff 2003)); Draft Supplement to Standard [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

IEEE Std 802.11 h—2003 (Amendment to IEEE Std 802.11, 1999 Edition (Reaff 2003)); as amended by IEEE Stds 802.11 a-1999, 802.11 b-1999, 802.11 b-1999/Cor 1-2001, 802.11 d-2001, and 802.11g-2003; IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 5: Spectrum and Transmit Power Management Extensions in the 5 GHz band in Europe; IEEE Computer Society LAN/MAN Standards Committee; Oct. 14, 2003; 74 pages.

IEEE Std 802.11 n; IEEE P802.11-04/0889r6; Wireless LANs, TGn Sync Proposal Technical Specification; May 2005; 131 pages.

IEEE Std 802.16-2004 (Revision of IEEE Std 802.16-2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 paqes.

IEEE Std 802.20-PD-06, IEEE P 802.20 V14, Jul. 16, 2004, Draft 802.20 Permanent Document, System Requirements for IEEE 802.20 Mobile Broadband Wireless Access Systems—Version 14, 23 pages.

* cited by examiner

CHANNEL DECODER AND METHOD FOR GENERATING EQUALIZED DATA AND DATA ESTIMATES BASED ON MULTIPLE SETS OF DEPTHS PROVIDED VIA A VITERBI ALGORITHM

CROSS-REFERENCE TO RELATED APPLICATIONS

The present disclosure is a continuation of U.S. patent application Ser. No. 13/219,917 (now U.S. Pat. No. 8,413,032), filed Aug. 29, 2011, which is a continuation of U.S. patent application Ser. No. 11/784,291 (now U.S. Pat. No. 8,010,883), filed Apr. 6, 2007. This application claims the benefit of U.S. Provisional Application No. 60/796,444, filed May 1, 2006. The entire disclosures of the applications referenced above are incorporated herein by reference.

FIELD

The present disclosure relates to receive channel detection architectures, and more particularly to performance of and noise cancellation within a receive channel.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Perpendicular magnetic recording (PMR) is a desired technology for hard disk drive storage due to its associated high storage densities. PMR refers to the vertical alignment of data bits on a recording medium, such as a disk. This vertical alignment provides additional space on the storage medium, thereby enabling higher recording densities. To decode the stored data on the storage medium, a trellis-based Viterbi detector is often coupled to an associated read channel and has certain performance limitations.

Referring to FIG. 1, a traditional read channel detection architecture 10 is shown. The architecture 10 includes a finite impulse response (FIR) filter 12 that receives data samples r(t) and generates an equalized data signal 14. The equalized signal 14 is received by a nonlinear Virterbi (NLV) detector 16 that has an internal Viterbi algorithm to determine the most likely sequence of hidden states. The Viterbi detector 16 produces a preliminary non-return-to-zero (NRZ) data estimates 18 and final NRZ data estimates 20. The final NRZ estimates are produced after a certain amount of latency. This latency is referred to as the Viterbi path memory length. The path memory length is set sufficiently long such that the surviving paths of the Viterbi algorithm merge with high probability and the final NRZ data estimates have good reliability. A surviving path is the most likely path to a particular hidden state.

The preliminary NRZ data estimates 18 have a smaller Viterbi path memory depth than the final NRZ data estimates 20 and thus are referred to as Viterbi early decisions. The early decisions are used to reconstruct the output of the FIR 12 by convolving with a partial response target or reconstruction filter 22. The preliminary NRZ data estimates 18 are received by the reconstruction filter 22 to generate reconstructed FIR outputs 24.

A delay block 26 is connected between the output 28 of the FIR 12 and the reconstruction filter 22. Reconstructed FIR outputs 24 are subtracted from the delayed FIR outputs 30 of the delay block 26 to generate an error signal 32. The error signal 32 is used to calculate error gradients for timing loop, automatic again control (AGC) loop, baseline correction loop, and FIR adaptation loop purposes.

The Viterbi early depth or path length of the preliminary NRZ estimates must be carefully and appropriately selected. When the early depth is too small, the Viterbi early decisions have too many errors, which cause the timing loop and the AGC loop to operate improperly. When the early depth is too long, the timing loop and the AGC loop cannot track fast-varying timing/gain errors.

During PMR of hard disk drives, the magnetoresistive read head produces a zero output voltage at magnetic transitions and a nonzero output in regions of constant magnetic polarity. Thus, the received signal r(t) in PMR has a nonzero DC response. In PMR, a main source of DC distortion or DC noise is the data dependent wandering of the baseline value from AC-coupling in the preamplifier and read channel. The baseline value is a DC reference value. As such, the baseline correction loop is incorporated as a feedback to reduce this DC noise.

The above-described architecture of FIG. 1 has performance limits. The NLV detector is well-equipped to handle data-dependent media noise, but suffers a performance loss when receiving a time variant DC noise, as described above when associated with PMR. This performance loss is primarily due to the relatively long latency of the baseline loop, which fails to adequately compensate for the time variant DC noise.

SUMMARY

A channel decoder is provided and includes a demodulator, a filter, a detector module, a first circuit, and a second circuit. The demodulator is configured to (i) receive an input signal based on data read from a storage medium, and (ii) demodulate the input signal to generate a data signal. The filter is configured to generate equalized data based on the data signal. The detector module is configured to (i) execute a Viterbi algorithm based on the equalized data to generate estimates of data originally stored in the storage medium, and (ii) based on the execution of the Viterbi algorithm, generate a first set of depths and a second set of depths. The first set of depths include depths larger than depths in the second set of depths. The first circuit is configured to generate a first error signal based on the first set of depths. The second circuit is configured to generate a second error signal based on the second set of depths. The filter generates the equalized data based on the first error signal and the second error signal.

In other features, a method is provided and includes: receiving an input signal based on data read from a storage medium; demodulating the input signal to generate a data signal; generating equalized data based on the data signal; and executing a Viterbi algorithm based on the equalized data to generate estimates of data originally stored in the storage medium. The method further includes, based on the execution of the Viterbi algorithm, generating a first set of depths and a second set of depths. The first set of depths includes depths larger than depths in the second set of depths. The method further includes: generating a first error signal based on the first set of depths; and generating a second error signal based on the second set of depths. The equalized data is generated based on the first error signal and the second error signal.

In other features, a detector is provided and includes a Viterbi module that generates a first preliminary data estimate signal and a second preliminary data estimate signal based on a received data signal. A first error loop generates a first error signal based on said first preliminary data estimate signal. A second error loop generates a second error signal based on the second preliminary data estimate signal.

In other features, the first error loop includes a target filter that generates a reconstructed signal based on the first preliminary data estimate signal. A delay block generates a delayed output signal. A summer generates an error signal based on the reconstructed signal and the delayed output signal.

In yet other features, the second error loop includes a target filter that generates a reconstructed signal based on the second preliminary data estimate signal. A delay block generates a delayed output signal. A summer generates an error signal based on the reconstructed signal and the delayed output signal.

In still other features, a first target filter is included that generates a first reconstructed signal based on the first preliminary data estimate signal. A second target filter generates a second reconstructed signal based on the second preliminary data estimate signal. A first delay block generates a first delayed output signal. A second delay block generates a second delayed output signal. A first summer that generates a first error signal based on the first reconstructed signal and the first delayed output signal.

In additional features, a second summer generates a second error signal based on the second reconstructed signal and the second delayed output signal. In other features, a first feedback output outputs the first error signal. A second feedback output outputs the second error signal. In other features, the first delay and the second delay match signal delay of the first preliminary data estimate signal and the second preliminary data estimate signal.

In further features, the detector generates the first preliminary data estimate signal based on a first Viterbi depth and the second preliminary data estimate signal based on a second Viterbi depth. In other features, the second Viterbi depth is less than the first Viterbi depth. In other features, the first Viterbi depth and the second Viterbi depth are stored predetermined values.

In other features, the detector generates a final data estimate signal based on the received data signal.

A channel decoder circuit is also provided that includes a detector that generates a first preliminary data estimate signal and a second preliminary data estimate signal based on a received data signal. A first error loop generates a first error signal based on the first preliminary data estimate signal. A second error loop generates a second error signal based on the second preliminary data estimate signal. A baseline loop generates a correction signal based on the second error signal.

In other features, the detector generates the first preliminary data estimate signal and a second preliminary data estimate signal based on the correction signal.

In yet other features, a timing loop is provided that generates a timing signal based on the first error signal. The detector generates the first preliminary data estimate signal and the second preliminary data estimate signal based on the timing signal.

In still other features, a gain loop is provided that generates a gain signal based on the first error signal. The detector generates the first preliminary data estimate signal and the second preliminary data estimate signal based on the gain signal.

In other features, a filter loop is provided that generates a weight signal based on the first error signal. The detector generates the first preliminary data estimate signal and the second preliminary data estimate signal based on the weight signal.

In additional features, the first error loop includes a target filter that generates a reconstructed signal based on the first preliminary data estimate signal. A delay block generates a delayed output signal based on the received data signal. A summer generates the first error signal based on the reconstructed signal and the delayed output signal.

In further features, the second error loop includes a target filter that generates a reconstructed signal based on the second preliminary data estimate signal. A delay block generates a delayed output signal based on the received data signal. A summer generates the second error signal based on the reconstructed signal and the delayed output signal.

In other features, a first target filter generates a first reconstructed signal based on the first preliminary data estimate signal. A second target filter generates a second reconstructed signal based on the second preliminary data estimate signal. A first delay block generates a first delayed output signal based on the received data signal. A second delay block generates a second delayed output signal based on the received data signal. A first summer generates the first error signal based on the first reconstructed signal and the first delayed output signal. A second summer generates the second error signal based on the second reconstructed signal and the second delayed output signal.

In other features, the detector generates a final data estimate signal based on the received data signal.

A method of operating a receive channel decoder is also provided and includes generating a first preliminary data estimate signal and a second preliminary data estimate signal based on a received data signal via a Viterbi module. A first error signal is generated based on the first preliminary data estimate signal. The second preliminary data estimate signal is feedback to generate a second error signal.

In other features, the first preliminary data estimate signal is filtered to generate a reconstructed signal. The received signal is delayed to generate a delayed output signal. The reconstructed signal and the delayed output signal are summed to generate an error signal.

In still other features, the second preliminary data estimate signal is filtered to generate a reconstructed signal. The received signal is delayed to generate a delayed output signal. The reconstructed signal and the delayed output signal are summed to generate an error signal.

In additional features, the first preliminary data estimate signal is filtered to generate a first reconstructed signal. The second preliminary data estimate signal is filtered to generate a second reconstructed signal. The received signal is delayed to generate a first delayed output signal and a second delayed output signal. The first reconstructed signal and the first delayed output signal are summed to generate a first error signal. The second reconstructed signal and the second delayed output signal are summed to generate a second error signal. In other features, signal delay of the first preliminary data estimate signal and the second preliminary data estimate signal are matched.

In other features, the first preliminary data estimate signal is generated based on a first Viterbi depth and the second preliminary data estimate signal is based on a second Viterbi depth. In other features, the first Viterbi depth and the second Viterbi depth are stored as predetermined values.

In further features, a final data estimate signal is generated based on the received data signal.

A method of operating a receive channel decoder is further provided and includes generating a first preliminary data estimate signal and a second preliminary data estimate signal based on a received data signal via a Viterbi module. A first error signal is generated based on the first preliminary data estimate signal. A second error signal is generated based on the second preliminary data estimate signal. The second error signal is feedback to generate a correction signal.

In other features, the first preliminary data estimate signal and the second preliminary data estimate signal are generated based on said correction signal.

In yet other features, the first error signal is feedback to generate a timing signal. The first preliminary data estimate signal and the second preliminary data estimate signal are generated based on the timing signal.

In other features, the first error signal is feedback to generate a gain signal. The first preliminary data estimate signal and the second preliminary data estimate signal are generated based on the gain signal.

In still other features, the first error signal is feedback to generate a weight signal. The first preliminary data estimate signal and the second preliminary data estimate signal are generated based on the weight signal.

In other features, the first preliminary data estimate signal is filtered to generate a reconstructed signal. The received signal is delayed to generate a delayed output signal. The reconstructed signal and the delayed output signal are summed to generate the first error signal.

In other features, the second preliminary data estimate signal is filtered to generate a reconstructed signal. The received data signal is delayed to generate a delayed output signal. The reconstructed signal and the delayed output signal are summed to generate the second error signal.

In additional features, the first preliminary data estimate signal is filtered to generate a first reconstructed signal. The second preliminary data estimate signal is filtered to generate a second reconstructed signal. The received data signal is delayed to generate a first delayed output signal and a second delayed output signal. The first reconstructed signal and the first delayed output signal are summed to generate the first error signal. The second reconstructed signal and the second delayed output signal are summed to generate the second error signal.

In other features, a final data estimate signal is generated based on the received data signal.

A detector is further provided that includes Viterbi means for generating a first preliminary data estimate signal and a second preliminary data estimate signal based on a received data signal. First error loop means generates a first error signal based on the first preliminary data estimate signal. Second error loop means generates a second error signal based on the second preliminary data estimate signal.

In further features, the first error loop means includes target means that generates a reconstructed signal based on the first preliminary data estimate signal. Delay means generates a delayed output signal. Summing means generates an error signal based on the reconstructed signal and the delayed output signal.

In other features, the second error loop means includes target means that generates a reconstructed signal based on the second preliminary data estimate signal. Delay means generates a delayed output signal. Summing means generates an error signal based on the reconstructed signal and the delayed output signal.

In still other features, first target means generates a first reconstructed signal based on the first preliminary data estimate signal. Second target means generates a second reconstructed signal based on the second preliminary data estimate signal. First delay means generates a first delayed output signal. Second delay means generates a second delayed output signal. First summing means generates a first error signal based on the first reconstructed signal and the first delayed output signal. Second summing means generates a second error signal based on the second reconstructed signal and the second delayed output signal. In other features, first feedback means outputs the first error signal. Second feedback means outputs said second error signal. In other features, the first delay means and the second delay means match signal delay of the first preliminary data estimate signal and the second preliminary data estimate signal.

In yet other features, the Viterbi means generates the first preliminary data estimate signal based on a first Viterbi depth and the second preliminary data estimate signal based on a second Viterbi depth. In other features, the second Viterbi depth is less than the first Viterbi depth. In other features, the first Viterbi depth and the second Viterbi depth are stored predetermined values.

In other features, the Viterbi means generates a final data estimate signal based on the received data signal.

In other features, a channel decoder circuit includes Viterbi means that generates a first preliminary data estimate signal and a second preliminary data estimate signal based on a received data signal. First loop means generates a first error signal based on the first preliminary data estimate signal. Second loop means generates a second error signal based on the second preliminary data estimate signal. Baseline loop means generates a correction signal based on the second error signal.

In other features, the Viterbi means generates the first preliminary data estimate signal and the second preliminary data estimate signal based on the correction signal.

In other features, timing loop means generates a timing signal based on the first error signal. The Viterbi means generates the first preliminary data estimate signal and the second preliminary data estimate signal based on the timing signal.

In other features, gain loop means that generates a gain signal based on the first error signal, the Viterbi means generates the first preliminary data estimate signal and the second preliminary data estimate signal based on the gain signal.

In other features, filter loop means generates a weight signal based on the first error signal, the Viterbi means generates the first preliminary data estimate signal and the second preliminary data estimate signal based on the weight signal.

In other features, the first loop means includes target means that generates a reconstructed signal based on the first preliminary data estimate signal. Delay means generates a delayed output signal based on the received data signal. Summing means generates the first error signal based on the reconstructed signal and the delayed output signal.

In other features, the second loop means includes target means that generates a reconstructed signal based on the second preliminary data estimate signal. Delay means generates a delayed output signal based on the received data signal. Summing means generates the second error signal based on the reconstructed signal and the delayed output signal.

In other features, first target means generates a first reconstructed signal based on the first preliminary data estimate signal. Second target means generates a second reconstructed signal based on the second preliminary data estimate signal. First delay means generates a first delayed output signal based on the received data signal. Second delay means generates a second delayed output signal based on the received data signal. First summing means generates the first error signal based on the first reconstructed signal and the first delayed output signal. Second summing means generates the second error signal based on the second reconstructed signal and the second delayed output signal.

In other features, the Viterbi means generates a final data estimate signal based on the received data signal.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
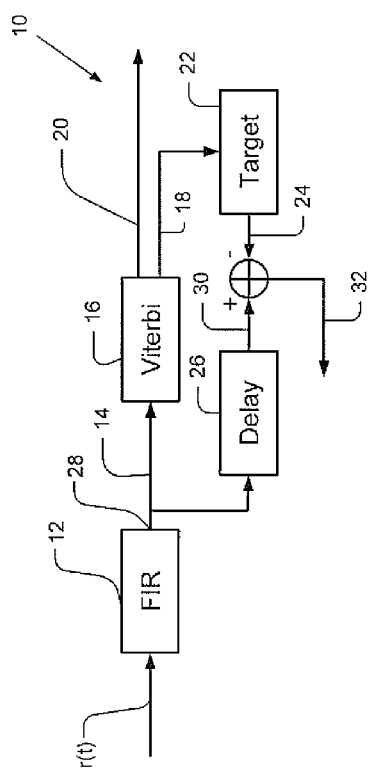
FIG. 1 is a high level block diagram of a read channel detection architecture according to the prior art.

The following description is merely exemplary in nature and is in no way intended to limit the disclosure, its application, or uses. For purposes of clarity, the same reference numbers will be used in the drawings to identify similar elements. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

It is desirable in perpendicular magnetic recording to minimize DC noise or noise around the DC information signal. One technique that may be used to reduce the DC noise is to reduce the baseline loop latency to obtain early decisions by use of a smaller Viterbi depth. Although such a technique reduces DC noise, it increases the risk associated with the break down of timing loop and automatic gain control. The embodiments of the present disclosure reduce the DC noise without negatively affecting loop timing and automatic gain control.

Figure 2:
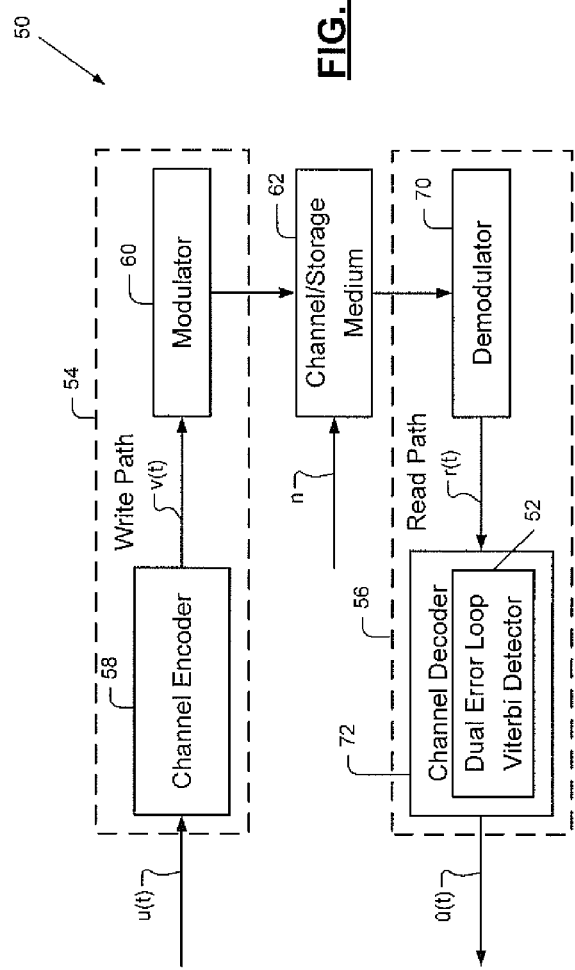
FIG. 2 is a functional block diagram illustrating a coded storage system incorporating a dual error loop Viterbi detector according to an embodiment of the present disclosure.

Referring to FIG. 2, a coded storage system 50 that incorporates a dual error loop Viterbi detector ("detector") 52 is shown. The storage system 50 includes a write path 54 and a read path 56. The write path 54 has a channel encoder 58 that receives an information data stream u(t) and generates a codeword data stream v(t). The codeword data stream v(t) is received by a modulator 60 and written to a channel/storage medium 62. Although the embodiment of FIG. 2 is directed to a storage system, one skilled in the art would recognize its applicability to other communication mediums. As such, the write path 54, the read path 56 and the channel/storage medium 62 may refer to any transmit path, receive path and encoded communication channel.

Signal n represents the noise that is experienced by and thus in effect added to the modulated signal 60. The combination of the noise n with the modulated signal 60 is received by a demodulator 70 of the read path 56. The demodulator 70 generates a received signal r(t), which is transmitted to a channel decoder 72. The channel decoder 72 contains the detector 52. The detector 52 generates an error signal based on the received signal r(t). An example error signal is shown and described with respect to the embodiment of FIG. 3. The error signal is used to drive feedback loops within the channel decoder 72, which in turn affects the information output signal û(t). The detector 52 and the operation thereof are described in further detail below.

Figure 3:
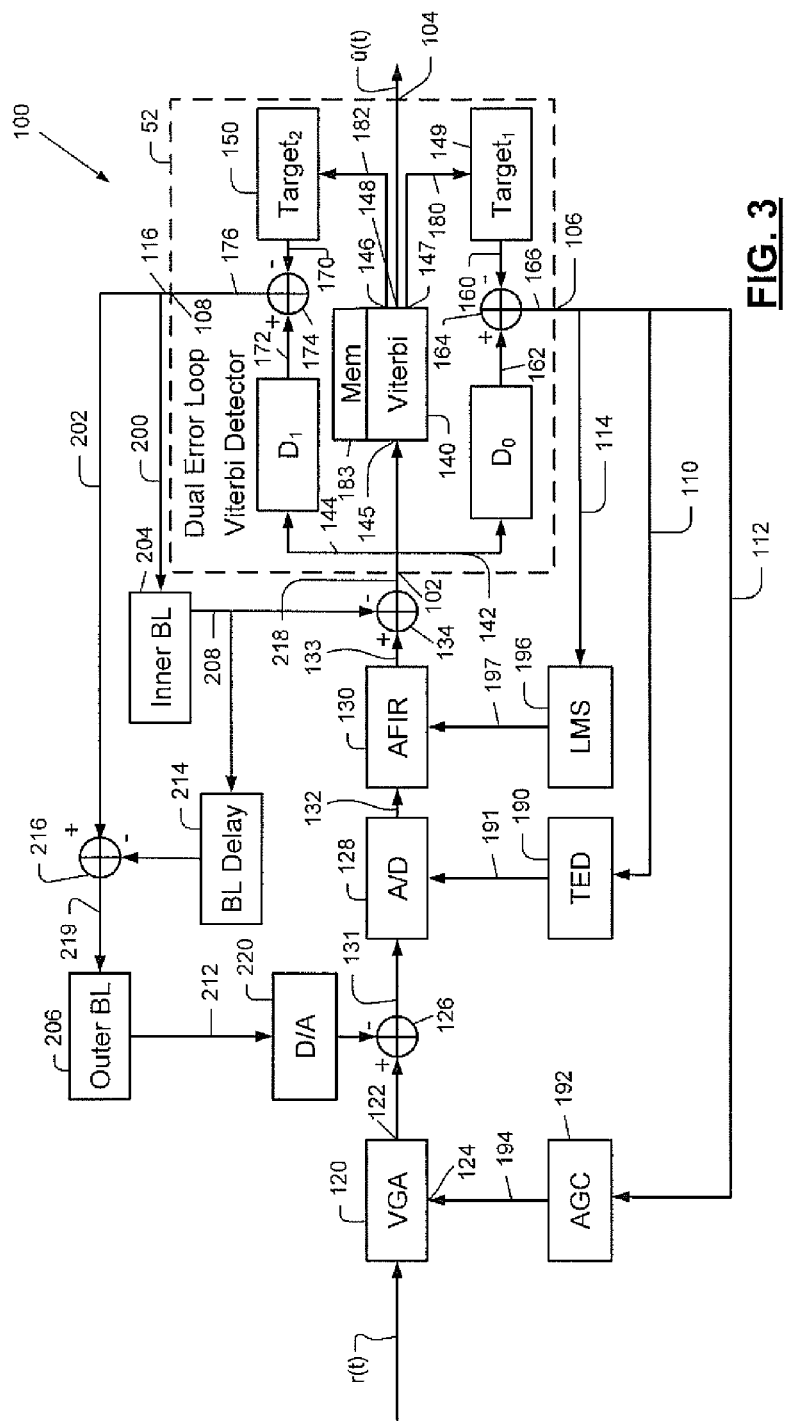
FIG. 3 is a functional block diagram of a receive channel detection circuit according to an embodiment of the present disclosure.

Referring to FIG. 3, a functional block diagram of a receive channel detection circuit 100 is shown. The receive channel circuit 100 may be referred to as a channel decoder and includes the detector 52. The detector 52 has an input 102, a final data output 104, a first error loop signal output 106 and a second error loop signal output 108. The first error output 106 is connected, respectively, to a timing loop 110, an automatic gain control (AGC) loop 112 and an adaptive finite impulse response (AFIR) filter loop 114. The second error output 108 is connected to a DC/baseline loop 116. As such, the first error output 106 may be referred to as the timing/AGC/AFIR output and the second error output 108 may be referred to as the DC/baseline output.

The receive channel circuit 100 receives the received signal r(t), which is passed through a variable gain amplifier (VGA) 120. The VGA 120 amplifies the received signal r(t) and has a VGA output 122 and a VGA feedback input 124. The VGA output 122 is connected to a first baseline (BL) summer 126, followed by an analog-to-digital (A/D) converter 128, which in turn is connected to an AFIR filter 130. The A/D converter 128 converts the analog summer output signal 131 into a digital input signal 132. The equalized data output signal 133 of the AFIR 130 is received by the detector 52. A second BL summer 134 is connected between the AFIR 130 and the detector 52.

The detector 52 includes a Viterbi detector module 140 that drives a pair of error loops 142, 144. The Viterbi detector module 140 has a Viterbi detector module input 145, a first preliminary data output 146, a second preliminary data output 147 and a final data output 148. The first error loop 142 has a first target/reconstruction filter 149 and a first delay block $D_0$ and is used for timing, AGC, and AFIR adjustment. The second error loop 144 has a second target/reconstruction filter 150 and a second delay block $D_1$ and is used for DC/baseline adjustment. The second error loop 144 provides a separate loop in which early decisions with smaller Viterbi depth can be used for the DC/baseline adjustment. By incorporating a second loop for the DC/baseline adjustment, the loops associated with the timing, AGC and the AFIR adjustment are not adversely affected.

In use, the first target/reconstruction filter 149 generates the first reconstructed output signal 160 and the first delay block $D_0$ generates the first delayed filter output signal 162. The first reconstructed output signal 160 is subtracted from the first delayed filter output signal 162 via a first error summer 164 to generate a first error signal 166. The first error signal 166 is provided to the timing loop 110, the AGC loop 112 and the AFIR loop 114. Likewise, the second target/reconstruction filter 150 generates, the second reconstructed output signal 170 and the second delay block $D_1$ generates the second delayed filter output signal 172. The second reconstructed output signal 170 is subtracted from the second delayed filtered output signal 172 via a second error summer 174 to generate a second error signal 176. The second error signal 176 is provided to the DC/baseline loop 116.

The Viterbi detector module 140 generates the early or preliminary NRZ data estimate signals 180, 182 and the final decision or final NRZ data estimate signal û(t) 104. The Viterbi detector module 140 may include one or more Viterbi detector sub-modules each of which having one or more associated Viterbi depths or constraint lengths. The depths refer to the number of cycles an input bit is retained and used after it first appears at the Viterbi detector module input 145. The depths may be referred to as memory lengths and correspond to a position within a memory buffer, such as the memory 183 of the Viterbi detector module 140. The preliminary NRZ data estimate signals 180, 182 include two sets of estimates that have a first set of Viterbi early depths and a second set of Viterbi early depths, respectively. The first set of early estimates is associated with the first error loop 142 and the second set of early estimates is associated with the second error loop 144. The Viterbi early depths are provided to the target/reconstruction filters 149 and 150. In general, the first set of Viterbi early depths are more than the second set of Viterbi early depths. The use of smaller Viterbi depths for the DC/baseline loop reduces noise around the DC signal of the receive channel detection circuit 100.

The following feedback loops are provided solely for example purposes. The feedback loops may be modified for various applications. Also, the feedback loops shown and described herein are not all inclusive; additional feedback loops may be incorporated. One or more of the feedback loops may be used, depending on the application.

The timing loop 110 is used for timing recovery of the originally transmitted encoded information signal. The timing loop 110 is shown as a feedback loop that receives the first error signal 166 and adjusts the timing of the A/D converter 128. The timing loop 110 may include a timing error detector 190, as shown, and/or one or more filters and oscillators, such as a voltage controlled oscillator or a numerically controlled oscillator. The timing loop 110 may be and/or also includes a phase lock loop. The timing error detector 190 generates a timing correction signal 191 that is received by the A/D converter 128.

The AGC loop 112 is shown as a feedback loop that receives the first error signal 166 and adjusts the gain on the VGA 120. The AGC loop 112 may have an AGC block 192 for processing and monitoring of the first error signal 166. The AGC block 192 generates a gain correction control signal 194, which is provided to the VGA 120.

The AFIR loop 114 is also shown as a feedback loop that receives the first error signal 166 and adjusts filter cutoff frequencies and/or other filter characteristics. The AFIR loop 114 may have a least means-square (LMS) block 196, which adjusts the weight vectors for the AFIR 130 to provide the minimum means square error. The LMS block 196 generates a weight correction signal 197 that is received by the AFIR 130.

The DC/baseline loop 116 is used for tracking an unknown or varying DC signal, such as that within perpendicular magnetic recording and may include one or more baseline sub-loops. In the example shown in FIG. 3, the baseline loop 116 includes a primary or inner loop 200 and an outer loop 202. The inner loop 200 provides correction at the Viterbi detector input 102. The outer loop 202 limits the DC offset to the A/D converter 128 and prevents clipping. The inner loop 200 includes an inner BL block 204 and the outer loop 202 includes an outer BL block 206.

The inner BL block 204 receives the second error signal 176 and generates an inner baseline correction signal 208. The inner baseline correction signal is summed with the equalized data output signal to generate a corrected equalized input signal 218 that is received by the detector 52. The outer BL block 206 receives the second error signal 176 adjusted by a delayed version of the inner baseline correction signal 208. The inner baseline correction signal 208 is delayed via a third BL delay block 214 and subtracted from the second error signal 176 by a BL summer 216 to generate a BL summer output signal 219. The outer BL block 206 generates an outer baseline correction signal 212 based on the BL summer output signal 219. The stated subtraction removes the inner BL correction term from the outer loop 202. Thus, the outer loop 202 is independent of the inner BL loop 200. The outer baseline correction signal 212 is converted into analog form by a digital-to-analog (D/A) converter 220 for subtraction from the amplified output signal 122 of the VGA 120.

Figure 4:
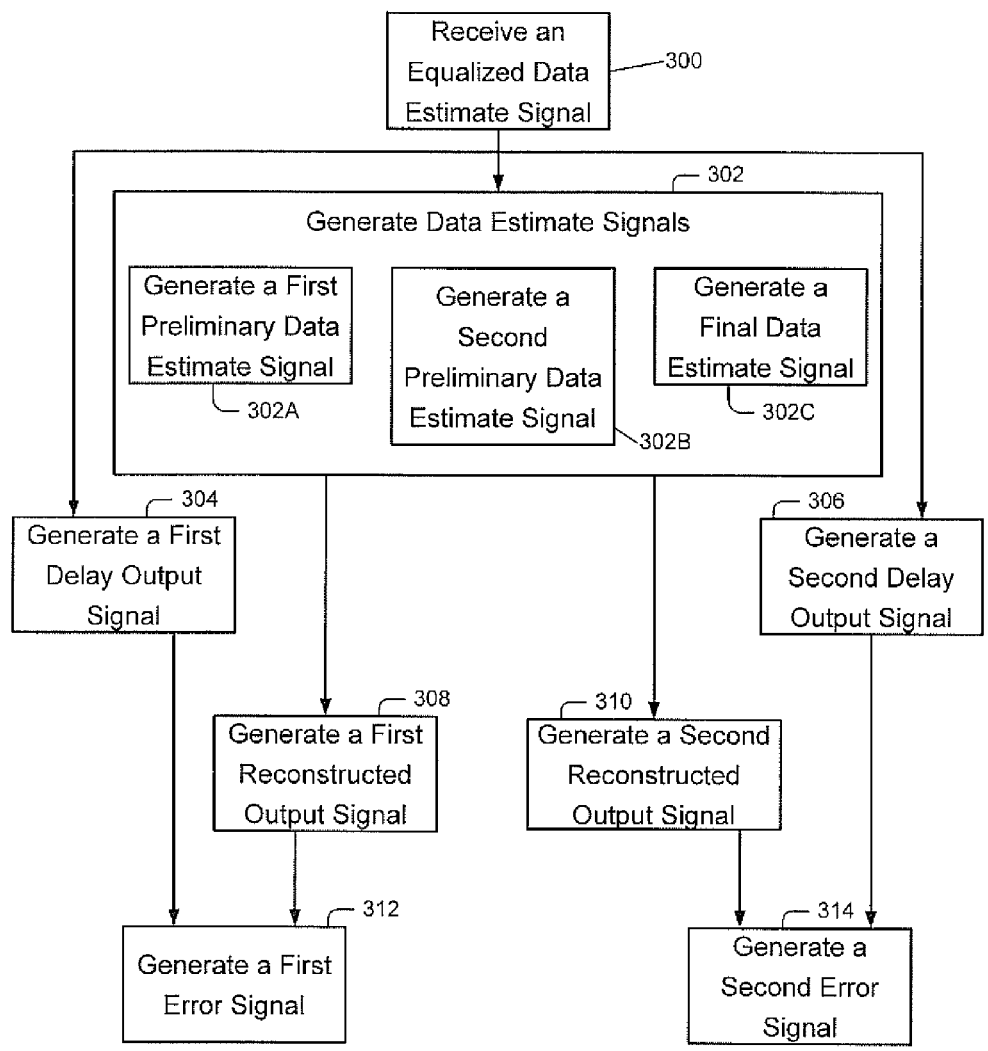
FIG. 4 is a data flow diagram illustrating an operational method of a receive channel decoder according to an embodiment of the present disclosure.

Referring to FIG. 4, a data flow diagram illustrating an operational method of a receive channel detection circuit is shown. Although the following steps are described primarily with respect to the embodiment of FIG. 3, they may be easily modified to apply to other embodiments of the present invention.

In step 300, an equalized data estimate signal, such as the equalized signal 133 or the corrected equalized input signal 218 is received by a dual error loop Viterbi detector, such as the detector 52. The equalized signal is simultaneously received by a Viterbi detector module, a first delay device and a second delay device, such as by the Viterbi detector module 140 and the delays $D_0$, $D_1$.

In step 302, the Viterbi detector module generates preliminary NRZ data estimate signals and a final NRZ data estimate signal, such as the signals 180, 182, û(t) based on the equalized signal. In step 302A, a first preliminary NRZ data estimate signal is generated based on a first Viterbi pipe delay and a first Viterbi early depth. In step 302B, a second preliminary NRZ data estimate signal is generated based on a second Viterbi pipe delay and a second Viterbi early depth. A Viterbi pipe delay refers to the time delay or number of clock cycles to perform the Viterbi decoding process of concern. In other words, a pipe delay is the computational length of the Viterbi detector module of interest or portion thereof.

In one embodiment, the first pipe delay is set equal to the second pipe delay and the second early depth is set less than the first early depth. In another example embodiment, the first early depth is set at approximately 11 and the second early depth is set at a value within an approximate range of 3-8. Of course, the early depth values are arbitrary relative values and may vary per application. For example, when an increase in DC noise is experienced, the second early depth value may be decreased to compensate and remove such noise. The delays and the depths of steps 302A and 302B may be predetermined set values stored in the Viterbi detector, a designated memory or otherwise generated. In step 302C, the final NRZ data estimate signal is generated.

In step 304, a first delayed filter output signal is generated based on the corrected equalized signal and a first delay, such as $D_0$. The first delay may correspond with and/or match the signal delay through the Viterbi detector module and/or the signal delay through the first reconstruction filter. The first delay is associated with the delay to generate the first preliminary NRZ estimate signal. In step 306, a second delayed filter output signal is generated based on the corrected equalized signal and a second delay, such as $D_1$. The second delay may correspond with and/or match the signal delay through the Viterbi detector module and/or the signal delay through the second reconstruction filter. The second delay is associated with the delay to generate the second preliminary NRZ estimate signal.

In step 308, a first reconstructed output signal is generated based on the first preliminary NRZ estimate signal via a first reconstruction filter, such as the first target/reconstruction filter 149. In step 310, a second reconstructed output signal is generated based on the second preliminary NRZ estimate signal via a second reconstruction filter, such as the second target/reconstruction filter 150. The reconstruction filters use the early decision Viterbi outputs to reconstruct a noise free Viterbi detector input. For example, if a Viterbi detector is matched to an equalization target H(D), then an associated reconstruction filter convolves the early decision Viterbi detector output with the equalization target H(D).

In step 312, the first reconstructed output signal is subtracted from the first delayed output signal to generate a first error signal. This may be performed via a first summer, such as the first summer 164. The first error signal is provided to a timing loop, an AGC loop, and/or an AFIR loop, such as the loops 110, 112, 114. In step 314, the second reconstructed output signal is subtracted from the second delayed output signal to generate a second error signal. This may be performed via a second summer, such as the second summer 174. The second error signal is provided to a DC/baseline loop, such as the loop 116.

The above-described steps may be performed sequentially, simultaneously, or in a different order depending upon the application. In the embodiment as described, step 304 is performed simultaneously with steps 302 and 308 and step 306 is performed simultaneously with steps 302 and 310. Also, in the described embodiment, step 312 is performed simultaneously with step 314.

Of course, the above-described read channel circuit 100, the method of FIG. 4 and, in general, the embodiments of the present invention may be applied to applications fall under IEEE standards 802.11, 802.11a, 802.11b, 802.11g, 802.11h, 802.11n, 802.16, and 802.20. Also, the embodiments of the present invention may be applied in wireless Bluetooth applications or in other applications in which information is being received from a storage or communication channel.

Referring now to FIGS. 5A-5G, various exemplary implementations incorporating the teachings of the present disclosure are shown.

Figure 5A:
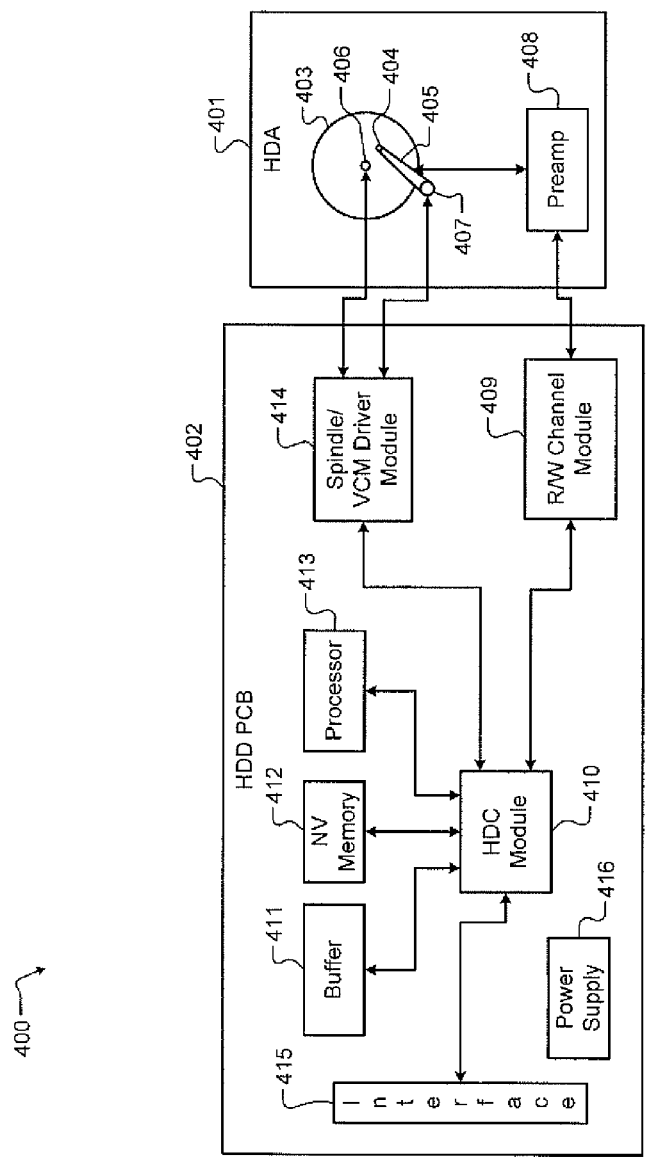
FIG. 5A is a functional block diagram of a hard disk drive.

Referring now to FIG. 5A, the teachings of the disclosure can be implemented in a read/write channel module (hereinafter, "read channel") 409 and/or an I/O Interface 415 of a hard disk drive (HDD) 400. For example, the above-described read channel reception circuit may be used to receive and decode information from a magnetic medium 403 of the HDD 400 or other channel. The HDD 400 includes a hard disk assembly (HDA) 401 and a HDD PCB 402. The HDA 401 may include the magnetic medium 403, such as one or more platters that store data, and a read/write device 404. The read/write device 404 may be arranged on an actuator arm 405 and may read and write data on the magnetic medium 403. Additionally, the HDA 401 includes a spindle motor 406 that rotates the magnetic medium 403 and a voice-coil motor (VCM) 407 that actuates the actuator arm 405. A preamplifier device 408 amplifies signals generated by the read/write device 404 during read operations and provides signals to the read/write device 404 during write operations.

The HDD PCB 402 includes the read channel 409, a hard disk controller (HDC) module 410, a buffer 411, nonvolatile memory 412, a processor 413, and a spindle/VCM driver module 414. The read channel 409 processes data received from and transmitted to the preamplifier device 408. The HDC module 410 controls components of the HDA 401 and communicates with an external device (not shown) via the I/O interface 415. The external device may include a computer, a multimedia device, a mobile computing device, etc. The I/O interface 415 may include wireline and/or wireless communication links.

The HDC module 410 may receive data from the HDA 401, the read channel 409, the buffer 411, nonvolatile memory 412, the processor 413, the spindle/VCM driver module 414, and/or the I/O interface 415. The processor 413 may process the data, including encoding, decoding, filtering, and/or formatting. The processed data may be output to the HDA 401, the read channel 409, the buffer 411, nonvolatile memory 412, the processor 413, the spindle/VCM driver module 414, and/or the I/O interface 415.

The HDC module 410 may use the buffer 411 and/or nonvolatile memory 412 to store data related to the control and operation of the HDD 400. The buffer 411 may include DRAM, SDRAM, etc. The nonvolatile memory 412 may include flash memory (including NAND and NOR flash memory), phase change memory, magnetic RAM, or multistate memory, in which each memory cell has more than two states. The spindle/VCM driver module 414 controls the spindle motor 406 and the VCM 407. The HDD PCB 402 includes a power supply 416 that provides power to the components of the HDD 400.

Figure 5B:
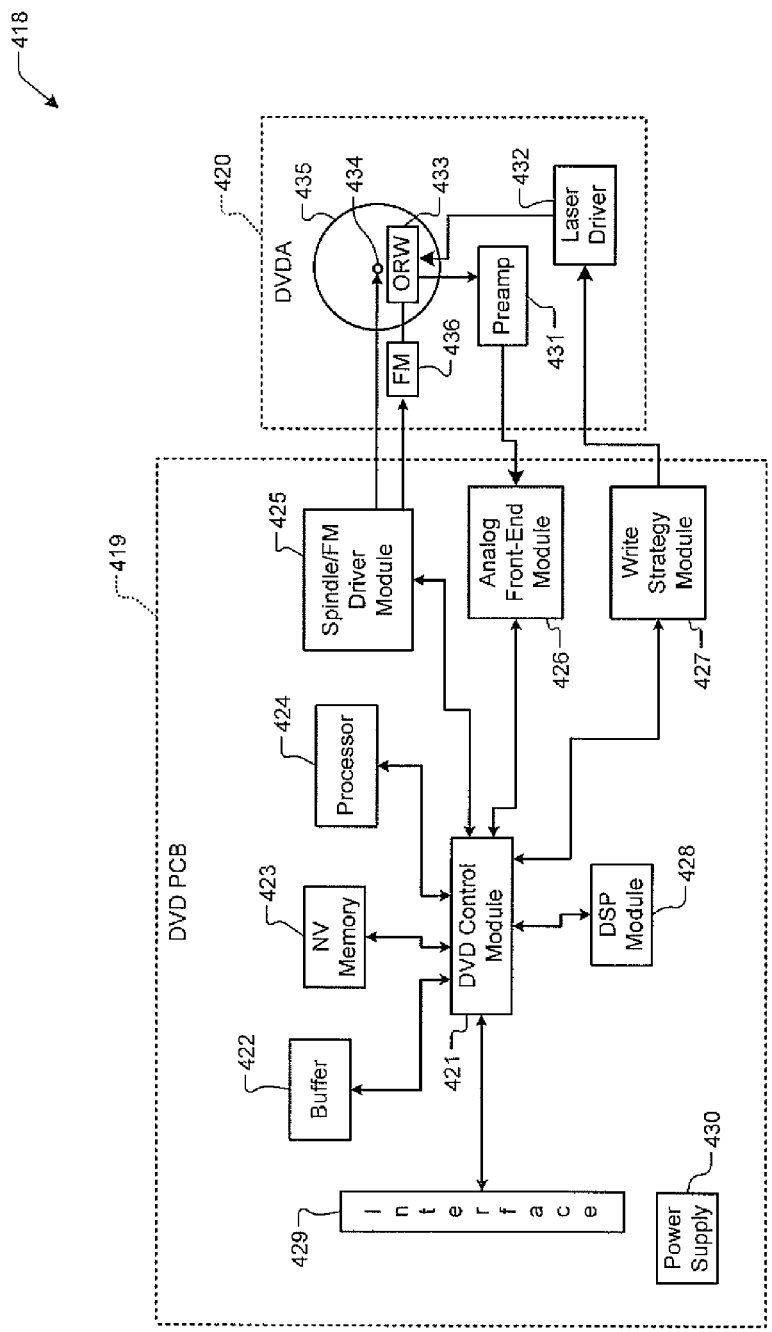
FIG. 5B is a functional block diagram of a DVD drive.

Referring now to FIG. 5B, the teachings of the disclosure can be implemented in an optical device 433 and/or an I/O interface 429 of a DVD drive 418 or of a CD drive (not shown). As with the HDD 400, the read channel circuit 100 may be incorporated into the DVD drive 418 to receive and decode information from a channel. The DVD drive 418 includes a DVD PCB 419 and a DVD assembly (DVDA) 420. The DVD PCB 419 includes a DVD control module 421, a buffer 422, nonvolatile memory 423, a processor 424, a spindle/FM (feed motor) driver module 425, an analog front-end module 426, a write strategy module 427, and a DSP module 428.

The DVD control module 421 controls components of the DVDA 420 and communicates with an external device (not shown) via an I/O interface 429. The external device may include a computer, a multimedia device, a mobile computing device, etc. The I/O interface 429 may include wireline and/or wireless communication links.

The DVD control module 421 may receive data from the buffer 422, nonvolatile memory 423, the processor 424, the spindle/FM driver module 425, the analog front-end module 426, the write strategy module 427, the DSP module 428, and/or the I/O interface 429. The processor 424 may process the data, including encoding, decoding, filtering, and/or formatting. The DSP module 428 performs signal processing, such as video and/or audio coding/decoding. The processed data may be output to the buffer 422, nonvolatile memory 423, the processor 424, the spindle/FM driver module 425, the analog front-end module 426, the write strategy module 427, the DSP module 428, and/or the I/O interface 429.

The DVD control module 421 may use the buffer 422 and/or nonvolatile memory 423 to store data related to the control and operation of the DVD drive 418. The buffer 422 may include DRAM, SDRAM, etc. The nonvolatile memory 423 may include flash memory (including NAND and NOR flash memory), phase change memory, magnetic RAM, or multi-state memory, in which each memory cell has more than two states. The DVD PCB 419 includes a power supply 430 that provides power to the components of the DVD drive 418.

The DVDA 420 may include a preamplifier device 431, a laser driver 432, and an optical device 433, which may be an optical read/write (ORW) device or an optical read-only (OR) device. A spindle motor 434 rotates an optical storage medium 435, and a feed motor 436 actuates the optical device 433 relative to the optical storage medium 435.

When reading data from the optical storage medium 435, the laser driver provides a read power to the optical device 433. The optical device 433 detects data from the optical storage medium 435, and transmits the data to the preamplifier device 431. The analog front-end module 426 receives data from the preamplifier device 431 and performs such functions as filtering and A/D conversion. To write to the optical storage medium 435, the write strategy module 427 transmits power level and timing information to the laser driver 432. The laser driver 432 controls the optical device 433 to write data to the optical storage medium 435.

Figure 5D:
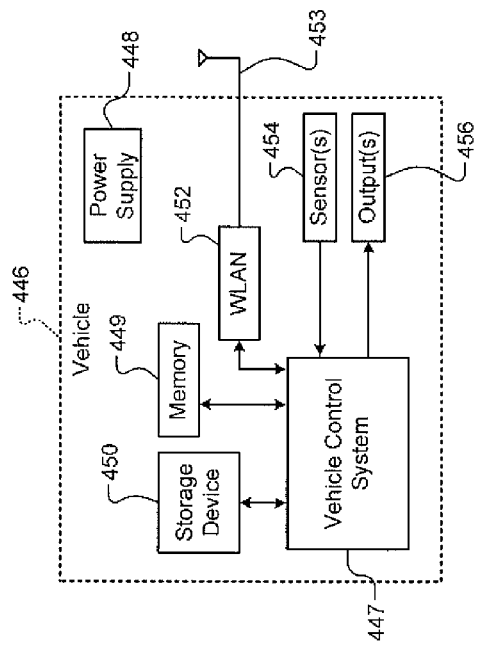
FIG. 5D is a functional block diagram of a vehicle control system.
Figure 5C:
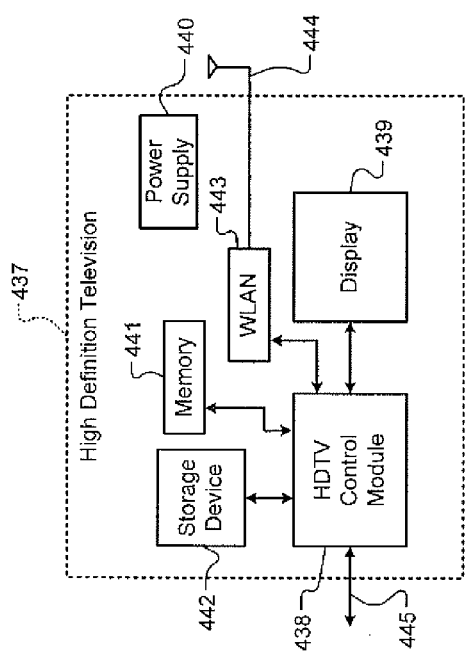
FIG. 5C is a functional block diagram of a high definition television.

Referring now to FIG. 5C, the teachings of the disclosure can be implemented in a WLAN interface 443 of a high definition television (HDTV) 437. As with the HDD 400, the read channel circuit 100 may be incorporated into the HDTV 437 to receive and decode information from a channel. The HDTV 437 includes a HDTV control module 438, a display 439, a power supply 440, memory 441, a storage device 442, the WLAN interface 443 and associated antenna 444, and an external interface 445.

The HDTV 437 can receive input signals from the WLAN interface 443 and/or the external interface 445, which sends and receives information via cable, broadband Internet, and/or satellite. The HDTV control module 438 may process the input signals, including encoding, decoding, filtering, and/or formatting, and generate output signals. The output signals may be communicated to one or more of the display 439, memory 441, the storage device 442, the WLAN interface 443, and the external interface 445.

Memory 441 may include random access memory (RAM) and/or nonvolatile memory such as flash memory, phase change memory, or multi-state memory, in which each memory cell has more than two states. The storage device 442 may include an optical storage drive, such as a DVD drive, and/or a hard disk drive (HDD). The HDTV control module 438 communicates externally via the WLAN interface 443 and/or the external interface 445. The power supply 440 provides power to the components of the HDTV 437.

Referring now to FIG. 5D, the teachings of the disclosure may be implemented in a WLAN interface 452 of a vehicle 446. As with the HDD 400, the read channel circuit 100 may be incorporated into the vehicle 446 to receive and decode information from a channel. The vehicle 446 may include a vehicle control system 447, a power supply 448, memory 449, a storage device 450, and the WLAN interface 452 and associated antenna 453. The vehicle control system 447 may be a powertrain control system, a body control system, an entertainment control system, an anti-lock braking system (ABS), a navigation system, a telematics system, a lane departure system, an adaptive cruise control system, etc.

The vehicle control system 447 may communicate with one or more sensors 454 and generate one or more output signals 456. The sensors 454 may include temperature sensors, acceleration sensors, pressure sensors, rotational sensors, airflow sensors, etc. The output signals 456 may control engine operating parameters, transmission operating parameters, suspension parameters, etc.

The power supply 448 provides power to the components of the vehicle 446. The vehicle control system 447 may store data in memory 449 and/or the storage device 450. Memory 449 may include random access memory (RAM) and/or nonvolatile memory such as flash memory, phase change memory, or multi-state memory, in which each memory cell has more than two states. The storage device 450 may include an optical storage drive, such as a DVD drive, and/or a hard disk drive (HDD). The vehicle control system 447 may communicate externally using the WLAN interface 452.

Figure 5F:
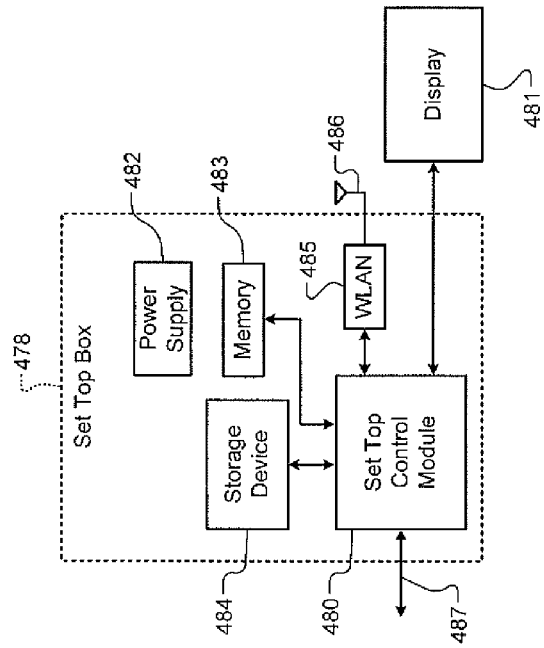
FIG. 5F is a functional block diagram of a set top box.
Figure 5E:
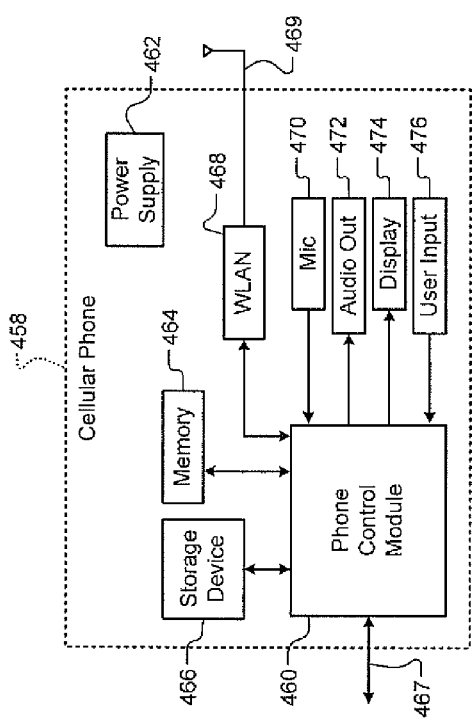
FIG. 5E is a functional block diagram of a cellular phone.

Referring now to FIG. 5E, the teachings of the disclosure can be implemented in a WLAN interface 468 of a cellular phone 458. As with the HDD 400, the read channel circuit 100 may be incorporated into the cellular phone 458 to receive and decode information from a channel. The cellular phone 458 includes a phone control module 460, a power supply 462, memory 464, a storage device 466, and a cellular network interface 467. The cellular phone 458 may include the WLAN interface 468 and associated antenna 469, a microphone 470, an audio output 472 such as a speaker and/or output jack, a display 474, and a user input device 476 such as a keypad and/or pointing device.

The phone control module 460 may receive input signals from the cellular network interface 467, the WLAN interface 468, the microphone 470, and/or the user input device 476. The phone control module 460 may process signals, including encoding, decoding, filtering, and/or formatting, and generate output signals. The output signals may be communicated to one or more of memory 464, the storage device 466, the cellular network interface 467, the WLAN interface 468, and the audio output 472.

Memory 464 may include random access memory (RAM) and/or nonvolatile memory such as flash memory, phase change memory, or multi-state memory, in which each memory cell has more than two states. The storage device 466 may include an optical storage drive, such as a DVD drive, and/or a hard disk drive (HDD). The power supply 462 provides power to the components of the cellular phone 458.

Referring now to FIG. 5F, the teachings of the disclosure can be implemented in a WLAN interface 485 of a set top box 478. As with the HDD 400, the read channel circuit 100 may be incorporated into the set top box 478 to receive and decode information from a channel. The set top box 478 includes a set top control module 480, a display 481, a power supply 482, memory 483, a storage device 484, and the WLAN interface 485 and associated antenna 486.

The set top control module 480 may receive input signals from the WLAN interface 485 and an external interface 487, which can send and receive information via cable, broadband Internet, and/or satellite. The set top control module 480 may process signals, including encoding, decoding, filtering, and/or formatting, and generate output signals. The output signals may include audio and/or video signals in standard and/or high definition formats. The output signals may be communicated to the WLAN interface 485 and/or to the display 481. The display 481 may include a television, a projector, and/or a monitor.

The power supply 482 provides power to the components of the set top box 478. Memory 483 may include random access memory (RAM) and/or nonvolatile memory such as flash memory, phase change memory, or multi-state memory, in which each memory cell has more than two states. The storage device 484 may include an optical storage drive, such as a DVD drive, and/or a hard disk drive (HDD).

Figure 5G:
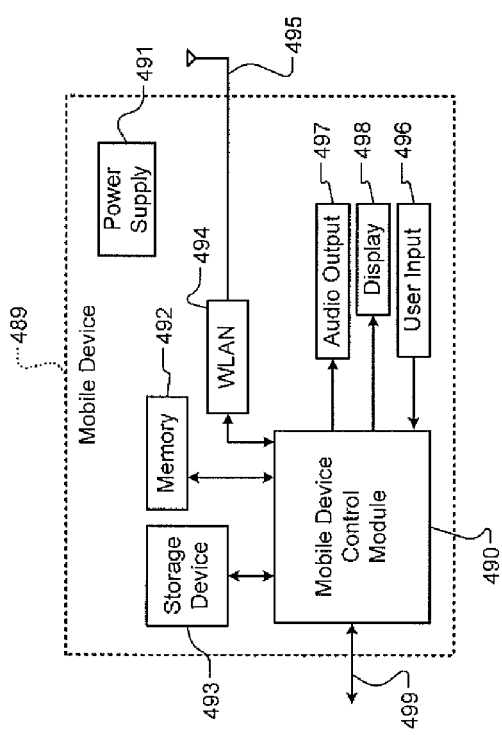
FIG. 5G is a functional block diagram of a mobile device.

Referring now to FIG. 5G, the teachings of the disclosure can be implemented in a WLAN interface 494 of a mobile device 489. As with the HDD 400, the read channel circuit 100 may be incorporated into the mobile device 489 to receive and decode information from a channel. The mobile device 489 may include a mobile device control module 490, a power supply 491, memory 492, a storage device 493, the WLAN interface 494 and associated antenna 495, and an external interface 499.

The mobile device control module 490 may receive input signals from the WLAN interface 494 and/or the external interface 499. The external interface 499 may include USB, infrared, and/or Ethernet. The input signals may include compressed audio and/or video, and may be compliant with the MP3 format. Additionally, the mobile device control module 490 may receive input from a user input 496 such as a keypad, touchpad, or individual buttons. The mobile device control module 490 may process input signals, including encoding, decoding, filtering, and/or formatting, and generate output signals.

The mobile device control module 490 may output audio signals to an audio output 497 and video signals to a display 498. The audio output 497 may include a speaker and/or an output jack. The display 498 may present a graphical user interface, which may include menus, icons, etc. The power supply 491 provides power to the components of the mobile device 489. Memory 492 may include random access memory (RAM) and/or nonvolatile memory such as flash memory, phase change memory, or multi-state memory, in which each memory cell has more than two states. The storage device 493 may include an optical storage drive, such as a DVD drive, and/or a hard disk drive (HDD). The mobile device may include a personal digital assistant, a media player, a laptop computer, a gaming console or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A channel decoder comprising:
a demodulator configured to (i) receive an input signal based on data read from a storage medium, and (ii) demodulate the input signal to generate a data signal;
a filter configured to generate equalized data based on the data signal;
a detector module configured to (i) execute a Viterbi algorithm based on the equalized data to generate estimates of data originally stored in the storage medium, and (ii) based on the execution of the Viterbi algorithm, generate a first set of depths and a second set of depths, wherein the first set of depths includes depths larger than depths in the second set of depths;
a first circuit configured to generate a first error signal based on the first set of depths; and
a second circuit configured to generate a second error signal based on the second set of depths,
wherein the filter generates the equalized data based on the first error signal and the second error signal.

2. The channel decoder of claim 1, further comprising:
an amplifier configured to amplify the input signal to generate an output; and
a summer configured to generate an output signal based on (i) the output of the amplifier, and (ii) the second error signal, wherein the filter is configured to generate the equalized data based on the output signal.

3. The channel decoder of claim 1, further comprising:
a first summer configured to generate the first error signal indicating a first error gradient based on the first set of depths; and
a second summer configured to generate the second error signal indicating a second error gradient based on the second set of depths.

4. The channel decoder of claim 3, further comprising:
a first delay device configured to delay the equalized data to generate a first delayed signal,
wherein the first summer is configured to generate the first error signal based on the first delayed signal; and
a second delay device configured to delay the equalized data to generate a second delayed signal,
wherein the second summer is configured to generate the second error signal based on the second delayed signal.

5. The channel decoder of claim 3, further comprising:
a first filter configured to filter a first estimate signal to generate a first output signal; and
a second filter configured to filter a second estimate signal to generate a second output signal,
wherein the detector module is configured to (i) generate the first estimate signal based on the first set of depths, and (ii) the second estimate signal based on the second set of depths.

6. The channel decoder of claim 5, further comprising:
a first delay device configured to delay the equalized data to generate a first delayed signal; and
a second delay device configured to delay the equalized data to generate a second delayed signal,
wherein the first summer is configured to generate the first error signal based on the first output signal and the first delayed signal, and
wherein the second summer is configured to generate the second error signal based on the second output signal and the second delayed signal.

7. The channel decoder of claim 1, further comprising a summer configured to generate a corrected signal based on the equalized data and the second error signal,
wherein the detector module is configured to, based on the corrected signal, generate (i) the estimates of the data originally stored in the storage medium, (ii) the first set of depths, and (iii) the second set of depths.

8. The channel decoder of claim 7, further comprising:
a timing error detector configured to generate a timing signal based on the first error signal; and
an analog-to-digital converter configured to generate a digital signal based on the data signal and the timing signal, wherein the data signal is an analog signal, and wherein the filter is configured to generate the equalized data in response to the digital signal.

9. The channel decoder of claim 1, further comprising a device configured to determine a least means square value based on the first error signal to generate a weight signal, wherein the weight signal indicates filter weights, and wherein the filter is configured to generate the equalized data in response to the weight signal.

10. The channel decoder of claim 1, further comprising:
a device configured to generate a gain signal based on the first error signal; and
an amplifier configured to amplify the data signal based on the gain signal,
wherein the filter is configured to generate the equalized data based on an output of the amplifier.

11. The channel decoder of claim 1, further comprising:
a first device configured to generate a first correction signal based on the second error signal; and
a first summer configured to generate a second correction signal based on the first correction signal and the equalized data,
wherein the detector module is configured to, based on the second correction signal, generate (i) the estimates of the data originally stored in the storage medium, (ii) the first set of depths, and (iii) the second set of depths.

12. The channel decoder of claim 11, further comprising:
a delay device configured to delay the first correction signal;
a second summer configured to generate a first output signal based on the second error signal and in response to an output of the delay device;
a second device configured to (i) limit a direct current offset of the output signal, and (ii) generate a third correction signal based on the first output signal, wherein the third correction signal indicates the direct current offset; and
a third summer configured to generate a second output signal based on the data signal and the third correction signal,
wherein the filter is configured to generate the equalized data based on the second output signal.

13. A method comprising:
receiving an input signal based on data read from a non-transitory storage medium;
demodulating the input signal to generate a data signal;
generating equalized data based on the data signal;
executing a Viterbi algorithm based on the equalized data to generate estimates of data originally stored in the non-transitory storage medium;
based on the execution of the Viterbi algorithm, generating a first set of depths and a second set of depths, wherein the first set of depths includes depths larger than depths in the second set of depths;
generating a first error signal based on the first set of depths; and
generating a second error signal based on the second set of depths,
wherein the equalized data is generated based on the first error signal and the second error signal.

14. The method of claim 13, further comprising:
generating the first error signal indicating a first error gradient based on the first set of depths; and
generating the second error signal indicating a second error gradient based on the second set of depths.

15. The method of claim 14, further comprising:
delaying the equalized data to generate a first delayed signal;
delaying the equalized data to generate the first error signal;
generating a second delayed signal based on the equalized data; and
generating the second error signal based on the second delayed signal.

16. The method of claim 14, further comprising:
filtering a first estimate signal to generate a first output signal;
filtering a second estimate signal to generate a second output signal;
generating the first estimate signal based on the first set of depths; and
generating the second estimate signal based on the second set of depths.

17. The method of claim 16, further comprising:
delaying the equalized data to generate a first delayed signal;
delaying the equalized data to generate a second delayed signal;
generating the first error signal based on the first output signal and the first delayed signal; and
generating the second error signal based on the second output signal and the second delayed signal.

18. The method of claim 13, further comprising:
generating a corrected signal based on the equalized data and the second error signal; and
based on the corrected signal, generating (i) the estimates of the data originally stored in the non-transitory storage medium, (ii) the first set of depths, and (iii) the second set of depths.

19. The method of claim 18, further comprising:
generating a timing signal based on the first error signal;
generating a digital signal based on the data signal and the timing signal, wherein the data signal is an analog signal; and
generating the equalized data in response to the digital signal.

20. The method of claim 13, further comprising:
generating a first correction signal based on the second error signal;
generating a second correction signal based on the first correction signal and the equalized data; and
based on the second correction signal, generating (i) the estimates of the data originally stored in the non-transitory storage medium, (ii) the first set of depths, and (iii) the second set of depths.

* * * * *